US008587391B2

(12) United States Patent
Gilbert et al.

(10) Patent No.: US 8,587,391 B2
(45) Date of Patent: *Nov. 19, 2013

(54) ACOUSTIC COUPLING LAYER FOR COUPLED RESONATOR FILTERS AND METHOD OF FABRICATING ACOUSTIC COUPLING LAYER

(75) Inventors: Steve Gilbert, San Francisco, CA (US); Rick Snyder, Windsor, CO (US); John D. Larson, III, Palo Alto, CA (US); Phil Nikkel, Loveland, CO (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 784 days.

This patent is subject to a terminal disclaimer.

(21) Appl. No.: 12/710,590

(22) Filed: Feb. 23, 2010

(65) Prior Publication Data
US 2011/0204996 A1 Aug. 25, 2011

(51) Int. Cl.
*H03H 9/205* (2006.01)
*H03H 9/54* (2006.01)

(52) U.S. Cl.
USPC .................. 333/189; 310/322; 310/334

(58) Field of Classification Search
USPC .......... 333/133, 187–192; 310/322, 324, 334, 310/335
See application file for complete search history.

(56) References Cited

U.S. PATENT DOCUMENTS

| | | | |
|---|---|---|---|
| 4,931,752 A * | 6/1990 | Bray et al. ..................... 333/151 |
| 5,587,620 A | 12/1996 | Ruby et al. | |
| 5,873,153 A | 2/1999 | Ruby et al. | |
| 6,107,721 A | 8/2000 | Lakin | |
| 6,507,983 B1 | 1/2003 | Ruby et al. | |
| 6,720,844 B1 | 4/2004 | Lakin | |
| 6,946,928 B2 | 9/2005 | Larson, III et al. | |
| 6,954,117 B2 * | 10/2005 | Komuro et al. ............... 333/133 |
| 7,019,605 B2 | 3/2006 | Larson, III | |
| 7,173,361 B2 * | 2/2007 | Saito et al. ..................... 310/320 |
| 7,230,509 B2 * | 6/2007 | Stoemmer ....................... 333/133 |
| 7,242,270 B2 | 7/2007 | Larson, III et al. | |
| 7,280,007 B2 | 10/2007 | Feng et al. | |
| 7,388,454 B2 | 6/2008 | Ruby et al. | |
| 7,391,286 B2 | 6/2008 | Jamneala et al. | |
| 7,400,217 B2 | 7/2008 | Larson, III et al. | |
| 7,425,787 B2 | 9/2008 | Larson, III | |
| 7,535,324 B2 | 5/2009 | Fattinger et al. | |
| 7,629,865 B2 | 12/2009 | Ruby | |
| 7,947,611 B2 * | 5/2011 | Ho et al. ......................... 438/780 |

(Continued)

OTHER PUBLICATIONS

Denisse, C.M.M., et al., "Plasma-Enhanced Growth and Composition of Silicon Oxynitride Films", *J. Appl. Phys.*, vol. 60, No. 7. Oct. 1, 1986, 2536-2542.

(Continued)

*Primary Examiner* — Barbara Summons

(57) ABSTRACT

In accordance with a representative embodiment, a bulk acoustic wave (BAW) resonator structure, comprises: a first BAW resonator comprising a first lower electrode, a first upper electrode and a first piezoelectric layer disposed between the first lower electrode and the first upper electrode; a second BAW resonator comprising a second lower electrode, a second upper electrode and a second piezoelectric layer disposed between the second lower electrode and the second upper electrode; and a single-material acoustic coupling layer disposed between the first and second BAW resonators, the acoustic coupling layer having an acoustic impedance less than approximately 6.0 MRayls and an acoustic attenuation less than approximately 1000 dB/cm.

13 Claims, 7 Drawing Sheets

(56) References Cited

U.S. PATENT DOCUMENTS

| | | | |
|---|---|---|---|
| 8,283,999 B2* | 10/2012 | Elbrecht et al. | 333/189 |
| 8,390,397 B2* | 3/2013 | Jamneala et al. | 333/133 |
| 2005/0023931 A1* | 2/2005 | Bouche et al. | 310/327 |
| 2005/0093658 A1* | 5/2005 | Larson et al. | 333/191 |
| 2005/0168104 A1* | 8/2005 | Bouche et al. | 310/324 |
| 2006/0114080 A1* | 6/2006 | Larson, III | 333/187 |
| 2006/0119453 A1 | 6/2006 | Fattinger et al. | |
| 2007/0035364 A1 | 2/2007 | Sridhar et al. | |
| 2007/0205850 A1 | 9/2007 | Jamneala et al. | |
| 2008/0297278 A1 | 12/2008 | Handtmann et al. | |
| 2008/0297279 A1 | 12/2008 | Thalhammer et al. | |
| 2009/0096550 A1 | 4/2009 | Handtmann et al. | |
| 2011/0204997 A1* | 8/2011 | Elbrecht et al. | 333/191 |
| 2011/0237204 A1* | 9/2011 | Jamneala et al. | 455/73 |

OTHER PUBLICATIONS

Jamneala, Tiberiu, et al., "Ultra-Miniature Coupled Resonator Filter with Single Layer Acoustic Coupler", *IEEE Transactions on Ultrasonics, Ferroelectrics, and Frequency Control*, vol. 56, No. 11. Nov. 2009, 2553-2558.

Schoenholz, J.E. et al., "Plasma-Enhanced Deposition of Silicon Oxynitride Film", *Thin Solid Films* 1987, 285-291.

K.M. Lakin, "Bulk Acoustic Wave Coupled Resonator Filters", IEEE 2002 Frequency Control Symposium, p. 8-14, May 2002.

G.G. Fattinger, et al. "Single-to-balanced filters for mobile phones using coupled resonator BAW technology", 2004 IEEE Ultrasonics Symposium, p. 416-419, Aug. 2004.

M.K. Small, et al. "A de-coupled stacked bulk acoustic resonator (DSBAR) filter with 2 dB bandwidth >4%", 2007 IEEE Ultrasonics Symposium, p. 604-607, Oct. 2007.

T. Jamneala, et al. "Coupled resonator filter with single-layer acoustic coupler", IEEE Transaction on Ultrasonics, Ferroelectrics, and Frequency Control, p. 2320-2326, vol. 55, Oct. 2008.

S.R. Gilbert, et al. "An ultra-miniature, low cost single ended to differential filter for ISM band applications", Micro. Symp. Digest, 2008 IEEE MTT-S, p. 839-842, Jun. 2008.

M.J. Loboda, "New solutions for intermetal dielectrics using trimethylsilane-based PECVD processes", Microelectronic Eng., p. 15-23, vol. 50, 2000.

A. Grill, et al. "Ultralow-k dielectrics prepared by plasma-enhanced chemical vapor deposition", App. Phys. Lett., p. 803-805, vol. 79, 2001.

J. Kaitila, et al. "Measurement of acoustical parameters of thin films", 2006 IEEE Ultrasonics Symposium, p. 464-467, Oct. 2006.

C. Thomsen, et al. "Surface generation and detection of phonons by picosecond light pulses", Phys. Rev. B, p. 4129, vol. 34, 1986.

K.M. Lakin, "Coupled Resonator Filters", 2002 IEEE Ultrasonics Symposium, p. 901-908, 2002.

G.G. Fattinger, et al. "Coupled Bulk Acoustic Wave Resonator Filters: Key technology for single-to-balanced RF Filters" 2004 IEEE-MTT-S Digest, p. 927-929, 2004.

A.A. Shirakawa, et al. "Bulk Acoustic Wave Coupled Resonator Filters Synthesis Methodology", 2005 European Microwave Conference, vol. 1, Oct. 2005.

G.G. Fattinger, et al. "Spurious Mode Suppression in Coupled Resonator Filters", IEEE MTT-S International Microwave Symposium Digest, p. 409-412, 2005.

\* cited by examiner

| Sample | Deposition Pressure (Torr) | $\rho$ (g/cm$^3$) | $v$ (m/sec) | $Z$ (MRayls) |
|---|---|---|---|---|
| CDO 1 | 2.6 | 1.43 | 3740 | 5.4 |
| CDO 2 | 3.0 | 1.35 | 3330 | 4.5 |
| CDO 3 | 3.2 | 1.28 | 3115 | 4.0 |
| CDO 4 | 3.6 | 1.22 | 2695 | 3.3 |
| CDO 5 | 4.0 | 1.16 | 2335 | 2.7 |
| SiLK | n/a | 1.13 | 1960 | 2.2 |

FIG. 5

ACOUSTIC COUPLING LAYER FOR COUPLED RESONATOR FILTERS AND METHOD OF FABRICATING ACOUSTIC COUPLING LAYER

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) resonator. The BAW resonator includes an acoustic stack comprising, inter alia, a layer of piezoelectric material disposed between two electrodes. Acoustic waves achieve resonance across the acoustic stack, with the resonant frequency of the waves being determined by the materials in the acoustic stack. One type of BAW resonator comprises a piezoelectric film for the piezoelectric material. These resonators are often referred to as Film Bulk Acoustic Resonators (FBAR).

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to certain known resonators.

FBARs may comprise an acoustic stack disposed over air. In such a structure, the acoustic stack can be referred to as a membrane. Often, the membrane is suspended over a cavity provided in a substrate. Other FBARs comprise the acoustic stack formed over an acoustic mirror formed in the substrate.

Filters based on FBAR technology provide a comparatively low in-band insertion loss due to the comparatively high quality (Q) factor of FBAR devices. FBAR-based filters are often employed in cellular or mobile telephones that can operate in multiple frequency bands. In such devices, it is important that a filter intended to pass one particular frequency band ("the passband") should have a high level of attenuation at other nearby frequency bands which contain signals that should be rejected. Specifically, there may be one or more frequencies or frequency bands near the passband which contain signals at relatively high amplitudes that should be rejected by the filter. In such cases, it would be beneficial to be able to increase the filter's rejection characteristics at those particular frequencies or frequency bands, even if the rejection at other frequencies or frequency bands does not receive the same level of rejection.

One type of filter based on FBAR technology is known as a coupled resonator filter (CRF). A CRF comprises a coupling structure disposed between two vertically stacked FBARs. The CRF combines the acoustic action of the two FBARs and provides a bandpass filter transfer function. For a given acoustic stack, the CRF has two fundamental resonance modes, a symmetric mode and an asymmetric mode, of different frequencies. The degree of difference in the frequencies of the modes depends, inter alia, on the degree or strength of the coupling between the two FBARs of the CRF. If the degree of coupling between the two FBARs is too great (overcoupled), the passband is unacceptably wide, and an unacceptable 'swag' or 'dip' in the center of the passband results, as does an attendant unacceptably high insertion loss in the center of the passband. If the degree of coupling between the FBARs is too low (under-coupled), the passband of the CRF is too narrow.

The spreading of the passband due to overcoupling of the FBARs, and the swag in the center of the passband, has lead to efforts to reduce the degree of coupling between the FBARs of the CRF. For many known materials useful for acoustic coupling, the degree of coupling is too great, and results in an unacceptably high difference in the resonance frequencies of the modes of the CRF.

One known technique aimed at reducing the degree of coupling between the FBARs of the CRF involves the use of comparatively low acoustic impedance materials as the acoustic coupler. For example, silicon low-k (SiLK™) resin, which is known to one of ordinary skill in the art, has been investigated for use as an acoustic coupler in a CRF. While the use of known low acoustic impedance materials shows promise from the perspective of reduced coupling between FBARs in the CRF, and thereby improved passband characteristics, such known materials exhibit an unacceptably high acoustic attenuation resulting in an unacceptable degree of acoustic loss, and an undesirable reduction in Q.

For example, the acoustic attenuation at the even mode resonance (second resonance frequency) of a CRF having a SiLK™ coupling layer is unacceptably large, and causes a 'tilt' of the passband near the even mode resonance frequency. Furthermore, in many applications, CRFs are connected in series to provide multi-pole filters. Unfortunately, the unacceptable acoustic attenuation of SiLK™ at the even mode resonance frequency is additive in the series-connected resonators. The resultant insertion loss at the second resonance frequency and passband 'tilt' is thus further exacerbated.

Moreover, the step-coverage of spun-on SiLK™ in a CRF is non-uniform, and results in non-uniform coupling layer thickness, particularly near the perimeter of the acoustic resonator where topography is encountered. Such variations in the thickness of the layer of SiLK™ in CRF applications can perturb the coupling between the BAW resonators of the CRF. These perturbations can result in spurious modes and undesirable 'notches' in the passband of the CRF. Furthermore, SiLK™ has a comparatively large temperature coefficient of expansion and elastic stiffness. The resultant CRF has an unacceptably large temperature coefficient of frequency (TCF), which is not desirable in many applications.

What is needed, therefore, is a BAW resonator structure and method of fabrication that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 5 is a tabular representation of certain acoustic properties versus deposition pressure of CDO in accordance with a representative embodiment.

DEFINED TERMINOLOGY

Figure 1:
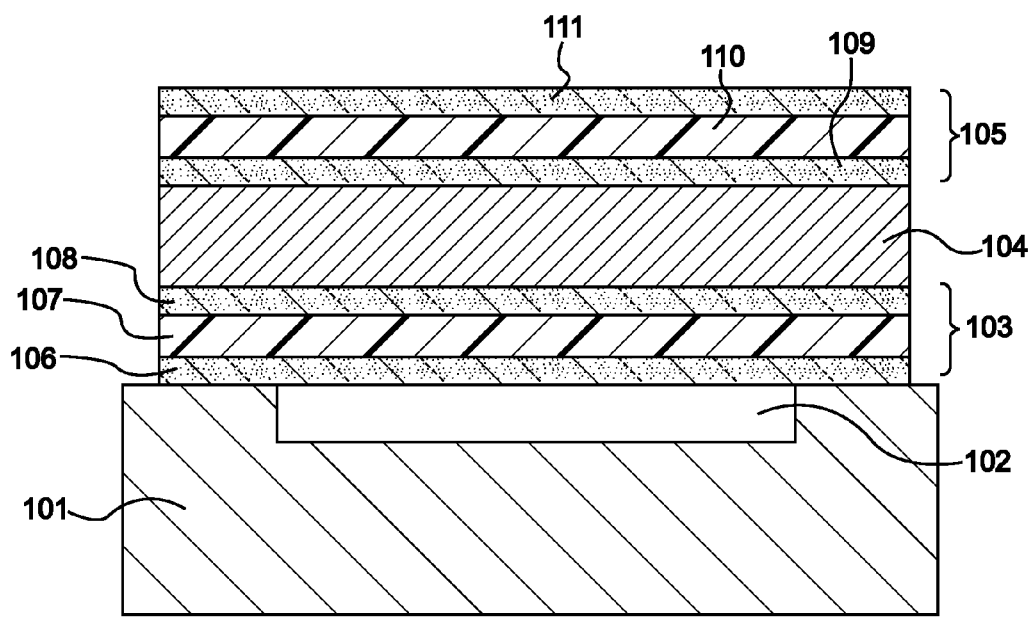
FIG. 1 is a cross-sectional view of a BAW resonator structure in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate to FBAR devices (FBARs), FBAR-based filters (e.g., CRFs), their materials and their methods of fabrication. Certain details of FBARs, FBAR-based filters, materials thereof and their methods of fabrication may be found in one or more of the following U.S. Pat. Nos. 6,107,721, to Lakin; U.S. Pat. Nos. 5,587,620, 5,873,153 and 6,507,983 to Ruby, et al.; U.S. Pat. No. 7,629,865, entitled "Piezoelectric Resonator Structures and Electrical Filters" to Richard C. Ruby, et al.; U.S. Pat. No. 7,280,007, entitled "Thin Film Bulk Acoustic Resonator with Mass Loaded Perimeter" to Hongjun Feng, et al.; and U.S. Pat. No. 7,855,618, entitled "Piezoelectric Resonator Structures and Electrical Filters having Frame Elements" to Jamneala, et al.; and U.S. Pat. No. 7,388,454, entitled "Acoustic Resonator Performance Enhancement Using Alternating Frame Structure" to Richard C. Ruby, et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

FIG. 1 is a cross-sectional view of a BAW resonator structure 100 in accordance with a representative embodiment. In representative embodiments, the BAW resonator structure 100 is configured through appropriate electrical connections (not shown) as a CRF. It is noted that this is merely illustrative, and it is emphasized that other configurations for other applications of the present teachings are contemplated by appropriate electrical connections. For example, the BAW resonator structure 100 may be used to provide a single-to-balanced signal converter.

The BAW resonator structure 100 comprises a substrate 101 and a cavity 102 (often referred to as a 'swimming pool'). Alternatively, rather than cavity 102, an acoustic mirror (not shown) comprising alternating layers of high and low acoustic impedance may be formed in the substrate 101 to provide acoustic isolation. A first BAW resonator 103 is disposed over the cavity 102 (or acoustic mirror). A single-material acoustic coupling layer 104 is disposed over the first BAW resonator 103. A second BAW resonator 105 is disposed over the single-material acoustic coupling layer 104. The first BAW resonator 103 comprises a first lower electrode 106, a first piezoelectric layer 107 and a first upper electrode 108. The second BAW resonator 105 comprises a second lower electrode 109, a second piezoelectric layer 110 and a second upper electrode 111 in sequence as shown.

In a representative embodiment, the single-material acoustic coupling layer 104 is a single layer. In other embodiments, an acoustic coupling structure comprising the single-material acoustic coupling layer 104 and at least one other layer is contemplated. Such an acoustic coupling structure would be disposed between the first BAW resonator 103 and the second BAW resonator 105. This illustrative acoustic coupling structure comprising the single-material acoustic coupling layer 104 may be fabricated in accordance with the present teachings. For example, a layer of $SiO_2$ may be formed beneath the single-material acoustic coupling layer 104; and another layer of $SiO_2$ may be formed above the single-material acoustic coupling layer 104. Further details of such an acoustic coupling structure comprising the single-material acoustic coupling layer 104 are disclosed in U.S. Pat. No. 8,283,999 entitled "Bulk Acoustic Resonator Structures Comprising a Single-Material Acoustic Coupling Layer Comprising Inhomogeneous Acoustic Property" to Elbrecht, et al. This commonly assigned patent application is filed concurrently, and the entire disclosure of this patent application is specifically incorporated herein by reference.

As described more fully below, the single-material acoustic coupling layer 104 has an acoustic impedance and acoustic attenuation that are tailored for a desired application by selection of a particular magnitude of a particular processing parameter. The single-material acoustic coupling layer 104 of the representative embodiment provides a discontinuity in the acoustic impedance needed to reduce the coupling between the first and second BAW resonators 103, 105 to a desired degree. In one configuration the first upper electrode 108 and the second lower electrode 109 are connected to ground; the input port is connected to the first lower electrode 106, and the output port is connected to electrode 111. As such the input port and the output port are coupled acoustically, but isolated electrically, and provide a single-ended to single-ended CRF. It is emphasized that this configuration is merely illustrative, and that other configurations based on the representative topology are contemplated. For example, one contemplated variant of the topology of the BAW resonator structure 100 provides a single-ended input to differential output CRF. Furthermore, and as will be appreciated by one of ordinary skill in the art, a plurality of BAW resonator structures 100 of the representative embodiment can be selectively connected to provide multiple-stage filters for a variety of applications. Beneficially, and unlike certain known CRFs, series connections of two or more BAW resonator structures 100 does not result in a significant reduction in the insertion loss at the second resonance frequency of the CRF, or a deleterious 'tilt' in the passband near the second resonance frequency.

In a representative embodiment, the electrodes 106, 108, 109 and 111 comprise molybdenum (Mo), or tungsten (W) or other materials suitable for use as electrodes in FBARs. The first and second piezoelectric layers 107, 110 illustratively comprise aluminum nitride (AlN) or other piezoelectric materials suitable for FBAR applications. The single-material acoustic coupling layer 104 comprises carbon-doped silicon oxide (SiOCH) fabricated by methods of representative embodiments below. Notably, SiOCH films of the representative embodiment belong to a general class of comparatively low dielectric constant (low-k) dielectric materials often referred to as carbon-doped oxide (CDO). Alternatively, the single-material acoustic coupling layer 104 may comprise other dielectric materials with suitable acoustic impedance and acoustic attenuation, including, but not limited to porous silicon oxynitride (SiON); porous boron doped silicate glass (BSG); or porous phosphosilicate glass (PSG). As described more fully below, regardless of the particular material selected for the single-material acoustic coupling layer 104, the acoustic impedance and the acoustic attenuation of the single-material acoustic coupling layer 104 are tailored to provide a desired passband characteristic. Moreover, and as will become clearer as the present description continues, the acoustic impedance of the single-material acoustic coupling layer 104 can be tailored during deposition and across its thickness. Thus, the acoustic impedance can be inhomogeneous (e.g., have a profile across its thickness). Notably, the gradient of the profile may be comparatively 'smooth', or may be a step-function with a comparatively discrete change(s) in the acoustic impedance to form regions of comparatively low and comparatively high acoustic impedance across its thickness.

Figure 2:
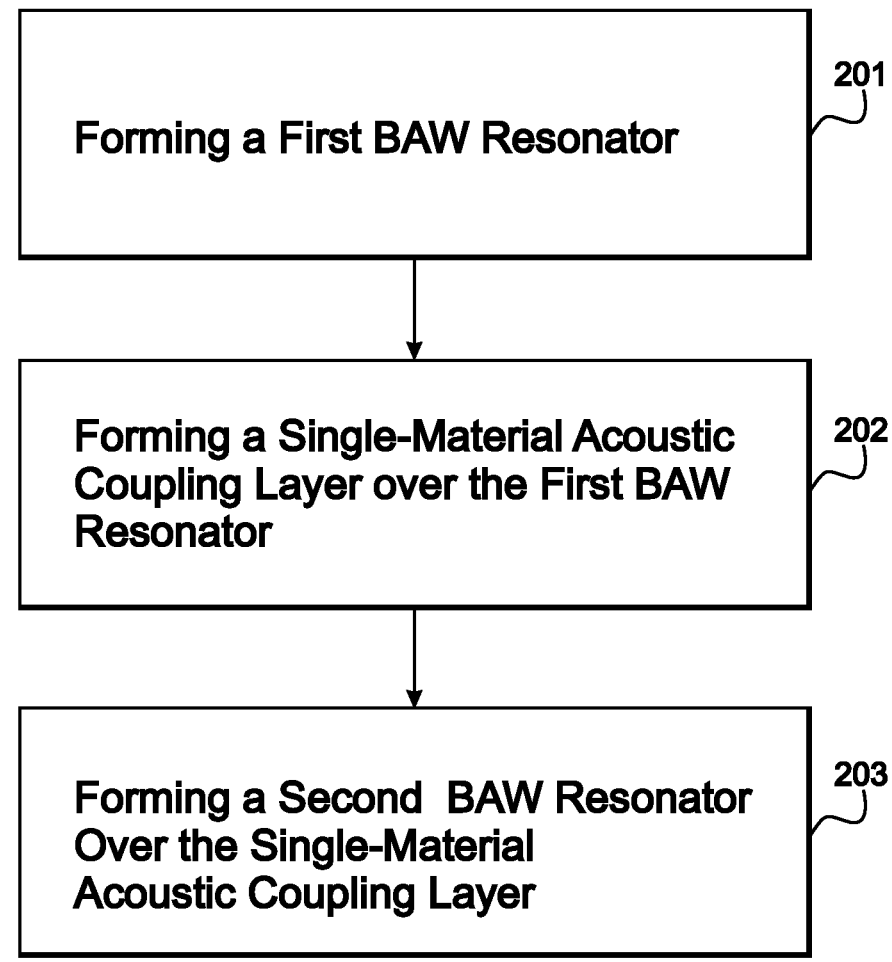
FIG. 2 is a flow-chart showing a method of fabricating a coupled resonator filter (CRF) in accordance with a representative embodiment.

FIG. 2 is a flow-chart showing a method of fabricating a CRF resonator structure 200 (e.g., BAW resonator structure 100) in accordance with a representative embodiment. As noted above, one useful configuration of the BAW resonator structure 100 is a CRF.

At 201, the method begins with forming a first BAW resonator (e.g., first BAW resonator 103 shown in FIG. 1). The first BAW resonator 103 may be formed by a known method. The first BAW resonator 103 may be formed over a sacrificial layer (not shown) provided in the cavity 102 in the substrate 101, or over an acoustic mirror (not shown). Notably, an adhesion layer may be provided over the first upper electrode 108 before forming the single-material acoustic coupling layer 104. Illustratively, a layer of silicon carbide (SiC) provides suitable adhesion of CDO to the electrode 108.

At 202, a single-material acoustic coupling layer (e.g., single-material acoustic coupling layer 104) is formed in accordance with a representative embodiment. As described more fully below, the single-material acoustic coupling layer comprises a desired acoustic impedance, or a desired acoustic attenuation, or both. The method of fabricating the single-material acoustic coupling layer of the representative embodiments allows for the tailoring of the acoustic impedance, or the acoustic attenuation, or both, through the selection of a particular magnitude of a particular processing parameter. In the presently described representative embodiment, the forming of the single-material acoustic coupling layer is directed to the formation of CDO with a desired acoustic impedance/acoustic attenuation combination that is achieved through the selection of chamber pressure during deposition.

In a representative embodiment the single-material acoustic coupling layer 104 comprises a single layer of CDO deposited using plasma enhanced chemical vapor deposition (PECVD). The PECVD process provides conformal coverage over three-dimensional surface topography, resulting in suitably uniform thickness of the resultant CDO layer across the first upper electrode 108 of the first BAW resonator 103. Illustratively, the CDO layer is deposited on 150 mm wafers in a known processing platform using a carbon-containing organosilicon precursor trimethylsilane (TMS) combined with an oxidizer gas ($N_2O$), similar to earlier reports of PECVD-prepared carbon doped oxides. The properties of the resultant CDO layers are detailed below.

As noted above, the CDO layers are deposited by PECVD over a range of chamber pressures tailored to provide the desired properties (e.g., density, acoustic impedance and acoustic attenuation) of the single-material acoustic coupling layer. It emphasized that the variation of chamber pressure to form the single-material acoustic coupling layer 104 comprising CDO with the desired properties is intended to be illustrative, and not limiting as the variation of other deposition parameters, including temperature, $N_2O$ gas flow rate, TMS flow rate, and RF power are contemplated to tailor the desired properties of the CDO.

As will become clearer as the present description continues, in one embodiment variation of the chamber pressure during deposition of the CDO can result in variation of the acoustic impedance by a factor of approximately 2:1 over the thickness of the single-material acoustic coupling layer 104. Thus, the method of a representative embodiment provides for the formation a single-material acoustic coupling layer having a variation in acoustic impedance over its thickness that is tailored for a particular application. Further details of the need for and use of single-material acoustic coupling material comprising an inhomogeneous acoustic impedance are presented in U.S. Pat. No. 8,283,999 entitled "Coupled Resonator Filters Comprising a Single-Material Acoustic Coupling Layer Comprising Inhomogeneous Acoustic Property" to Elbrecht, et al.

It is emphasized that the resultant single-material acoustic coupling layer and its method of fabrication are intended to be illustrative, and that other materials, such as those noted above, are contemplated for use as the single-material acoustic coupling layer of the present teachings. Generally, materials other than CDO may be formed by PECVD, using gases selected for the particular single-material acoustic coupling layer being fabricated. Like the illustrative method for forming CDO with a desired acoustic impedance/acoustic attenuation, selection of the chamber pressure during PECVD can be made for a particular acoustic impedance/acoustic attenuation. Alternatively, other deposition parameters, including temperature, N$_2$O gas flow rate, O$_2$ gas flow rate, precursor flow rate, and RF power can be selected to tailor the desired properties of the CDO acoustic coupling layer. Regardless of the material selected, the single-material acoustic coupling layer of the representative embodiments beneficially has an acoustic impedance in the range of approximately 1.0 MRayls and approximately 6.0 MRayls; and an acoustic attenuation that is in the range of approximately 2000 dB/cm (at 1 GHz) to approximately 10 dB/cm (at 1 GHz).

Notably, an adhesion layer (not shown) may be provided over the single-material acoustic coupling layer 104 before forming the second lower electrode 109. Again, a layer of SiC provides suitable adhesion of CDO to the electrode 109.

At 203, the method comprises forming a second BAW resonator (e.g., second BAW resonator 105 shown in FIG. 1). The second BAW resonator is formed using known methods and materials, such as described in the referenced patents and patent applications above. After completion of the fabrication of the second BAW resonator 105, the sacrificial material provided in the cavity 102 is released by a known method. Naturally, if an acoustic mirror is provided beneath the first BAW resonator 103, no such release step would be required.

Certain useful acoustic parameters of the CDO (density, velocity, and impedance) can be determined by measuring the thickness, mass, and acoustic propagation time of films deposited directly on blank Si wafers using known methods. For each of the PECVD process conditions examined, CDO films having different thicknesses (100 nm to 500 nm) were deposited and fully characterized. By measuring a thickness series for each process condition, it is possible to separate potential interface effects from bulk film properties. Thickness measurements may be obtained using a known X-Ray Reflectivity (XRR) method.

Figure 3:
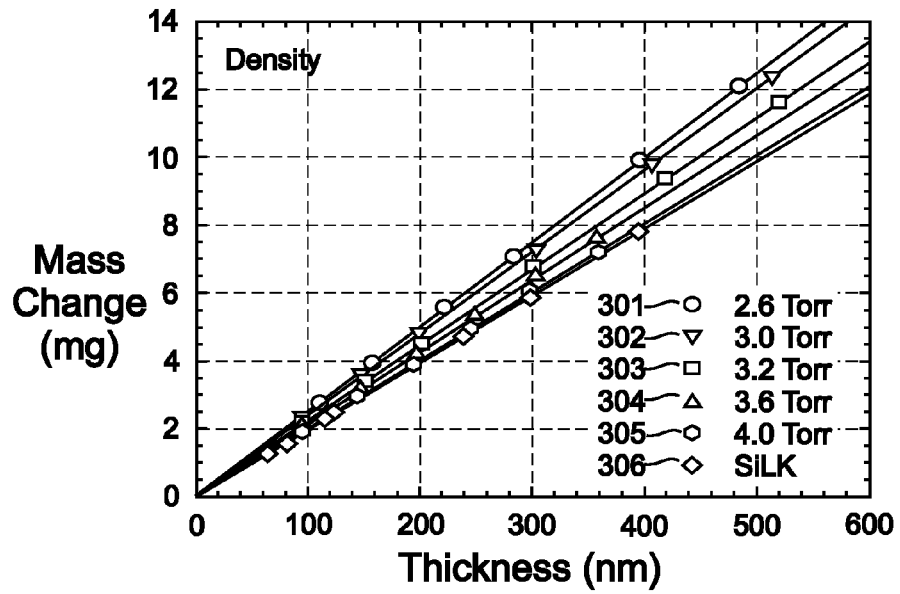
FIG. 3 is a graphical representation of a change in wafer mass versus film thickness of carbon-doped oxide (CDO) for CDO films deposited over a range of process pressures in accordance with a representative embodiment.

FIG. 3 is a graphical representation of a change in wafer mass versus film thickness of carbon-doped oxide (CDO) for CDO films deposited over a silicon (Si) substrate, and over a range of process pressures in accordance with a representative embodiment. Notably, curve 301 depicts the change in wafer mass versus thickness for CDO deposited at a chamber pressure of 2.6 Torr; curve 302 depicts the change in wafer mass versus thickness for CDO deposited at a chamber pressure of 3.0 Torr; curve 303 depicts the change in wafer mass versus thickness for CDO deposited at a chamber pressure of 3.2 Torr; curve 304 depicts the change in wafer mass versus thickness for CDO deposited at a chamber pressure of 3.6 Torr; curve 305 depicts the change in wafer mass versus thickness for CDO deposited at a chamber pressure of 4.0 Torr. Curve 306 depicts the change in wafer mass versus thickness for a known sample of SiLK™.

The density of films deposited with varying pressure may be determined by plotting the change in wafer mass before and after CDO film deposition versus thickness. The mass change associated with each film was measured, and each point on curves 301~305 represents an average of nine measurements per wafer. The change in mass varied from 1.95 to 12.4 mg depending upon film thickness and density. Given the wafer area and the slope of a linear fit to each of the thickness series shown, the CDO film density can be accurately determined according to:

$$\rho = m/V = m/dA, \quad (1)$$

where m is the mass of the film, V is the film volume, d is the average film thickness, and A is the wafer area. By varying deposition pressure from 2.6 to 4.0 Torr (curves 301~305), CDO films with densities ranging from approximately 1.16 g/cm$^3$ to approximately 1.43 g/cm$^3$ are obtained. Curve 306 depicts the results for a series of known SiLK™ films deposited with increasing thickness. The density of SiLK™ is 1.13 g/cm$^3$, only slightly less than the least dense CDO layer of FIG. 3. Notably, the density of CDO increases with decreasing chamber pressure, but in all instances presents a greater density than SiLK™ regardless of deposition pressure.

Figure 4:
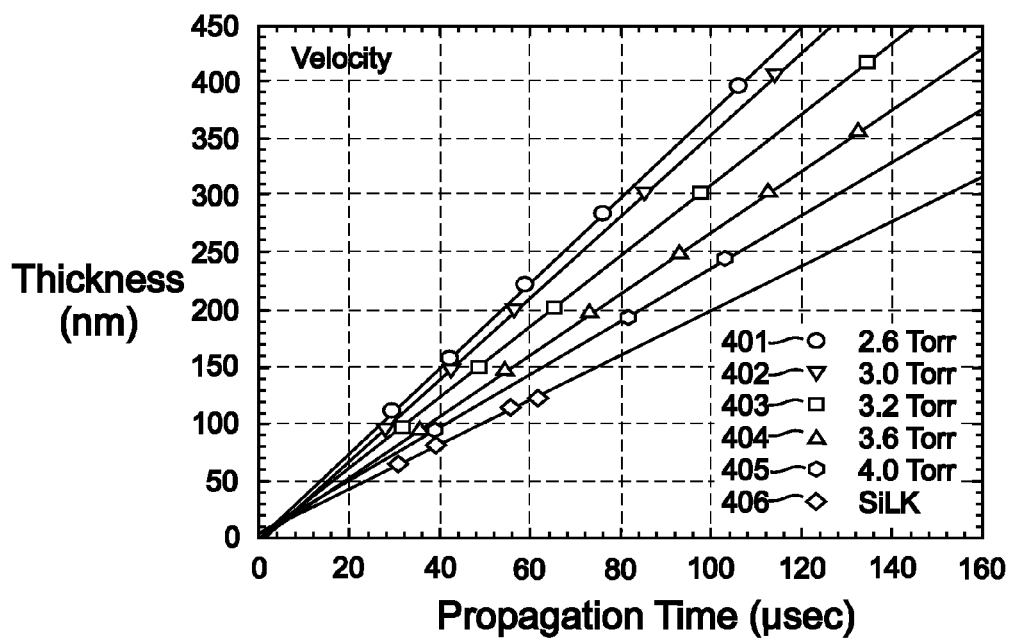
FIG. 4 is a graphical representation of CDO thickness versus propagation time for a single longitudinal pass through the CDO layer in accordance with a representative embodiment.

FIG. 4 is a graphical representation of CDO thickness versus propagation time for a single longitudinal pass through the CDO layer deposited over a silicon (Si) substrate, and over a range of process pressures in accordance with a representative embodiment. Notably, curve 401 depicts the propagation time versus thickness for CDO deposited at a chamber pressure of 2.6 Torr; curve 402 depicts the propagation time versus thickness for CDO deposited at a chamber pressure of 3.0 Torr; curve 403 depicts the propagation time versus thickness for CDO deposited at a chamber pressure of 3.2 Torr; curve 404 depicts the propagation time versus thickness for CDO deposited at a chamber pressure of 3.6 Torr; curve 405 depicts the propagation time versus thickness for CDO deposited at a chamber pressure of 4.0 Torr. Curve 406 depicts thickness versus propagation time for a known sample of SiLK™.

Longitudinal acoustic velocity is determined in CDO films of different thickness from the data of FIG. 4. The propagation time through the CDO can be measured using a known picosecond ultrasonics technique. Because the CDO is substantially optically transparent, a thin Al film was deposited over the surface to act as an opaque acoustic transducer. From the slope of a linear fit to each of curves 401~405, the longitudinal acoustic velocity (v) is determined according to the straightforward expression:

$$v = d/t, \quad (2)$$

where d is the CDO layer thickness and t is the time required for an acoustic wave to travel through the film. Sound velocities for the CDO films investigated range from 2335 to 3740 msec. By contrast, the sound velocity of SiLK™ was found to be 1960 msec, somewhat lower than any of the CDO films.

From the values of the density of the CDO layer and longitudinal velocity of an acoustic wave in the CDO layer, the acoustic impedance of each CDO layer of different thicknesses can be determined according to:

$$Z = \rho v \quad (3)$$

A summary of the density, velocity, and impedance measured for CDO fabricated in accordance with representative embodiments, and a known SiLK™ layer is provided in FIG. 5. The impedance of the CDO films fabricated at various chamber pressures ranges from 2.7 MRayls to 5.4 MRayls, compared to 2.2 MRayls for SiLK™.

Figure 6A:
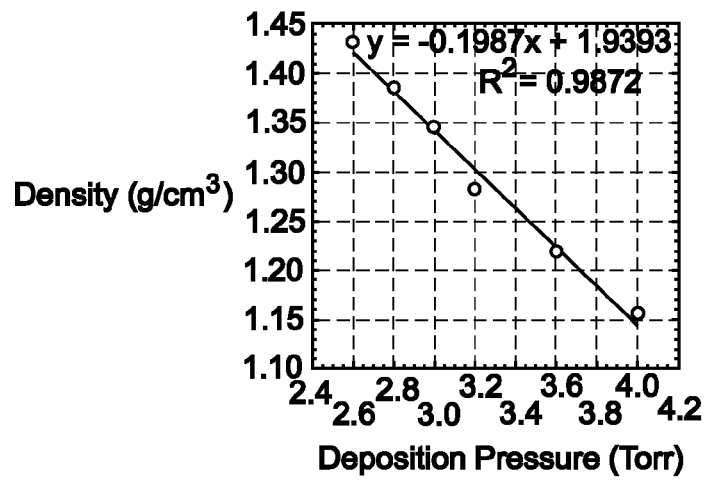
FIG. 6A is a graphical representation of density versus deposition pressure of CDO in accordance with a representative embodiment.
Figure 6B:
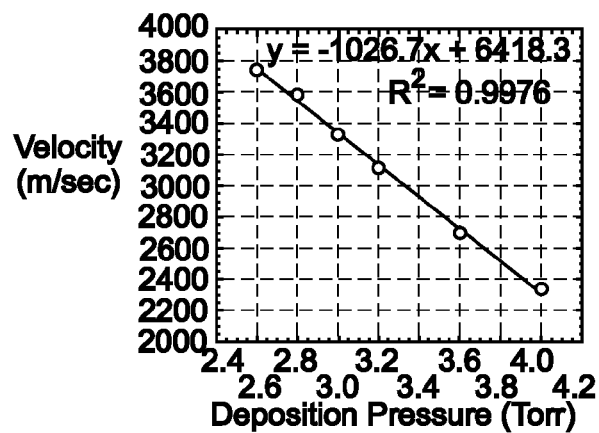
FIG. 6B is a graphical representation of acoustic velocity of a longitudinal acoustic wave versus deposition pressure of CDO in accordance with a representative embodiment.

FIG. 6A is a graphical representation of density versus deposition pressure of a CDO layer fabricated in accordance with a representative embodiment. Notably, the density of the CDO layer decreases substantially linearly with chamber pressure in PECVD deposition. It is believed that the additional pressure results in greater porosity in the resultant CDO layer. FIG. 6B is a graphical representation of acoustic velocity of a longitudinal acoustic wave versus deposition pressure of a CDO layer fabricated in accordance with a representative embodiment. The acoustic velocity of longitudinal modes also decreases linearly with chamber pressure in PECVD deposition.

Figure 6C:
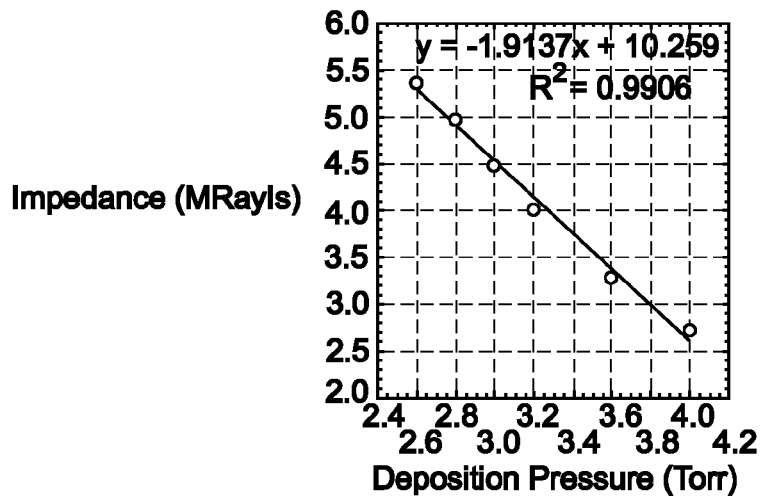
FIG. 6C is a graphical representation of acoustic impedance versus deposition pressure of CDO in accordance with a representative embodiment.

FIG. 6C is a graphical representation depicting acoustic impedance versus deposition pressure of a CDO acoustic coupling layer fabricated in accordance with a representative embodiment. The acoustic impedance is determined using the density and acoustic velocity data from FIGS. 6A–6B, and equation (3) above. The substantially linear decrease in density and acoustic velocity with increasing deposition pressure results in a substantially linear decrease in the acoustic impedance of the CDO layer with increasing chamber pressure during PECVD. As should be readily appreciated, the ability to tailor density of the CDO layer by selection of the chamber pressure in PECVD deposition, allows for the tailoring of the acoustic impedance of the CDO layer across its thickness. As such, a desired substantially uniform acoustic impedance of single-material acoustic coupling layer comprising CDO over a desired layer thickness can be realized by the selection of the chamber pressure during PECVD. Moreover, in accordance with a representative embodiment, the chamber pressure can be changed during fabrication of the single-material acoustic coupling layer to provide an acoustic impedance profile across the thickness of the single-material acoustic coupling layer. For example, by depositing the CDO for a first period of time at a first chamber pressure, a first portion of the CDO layer having a first thickness and a first acoustic impedance is fabricated. The chamber pressure can be changed as desired to a second chamber pressure, which is different than the first chamber pressure, for a second period of time.

By depositing the CDO for a second period of time at a second chamber pressure, a second portion of the CDO layer having a second thickness and a second acoustic impedance is fabricated over the first portion. Thus, single-material acoustic coupling layer comprises an acoustic impedance profile over its thickness, with the first portion of the acoustic coupling layer having a first acoustic impedance, and the second portion of the acoustic coupling layer having a second acoustic impedance that is different than the first acoustic impedance. The use and benefits of a single-material acoustic coupling layer having an inhomogeneous acoustic impedance across its thickness are described in the co-pending application to Elbrecht, et al.

Figure 7:
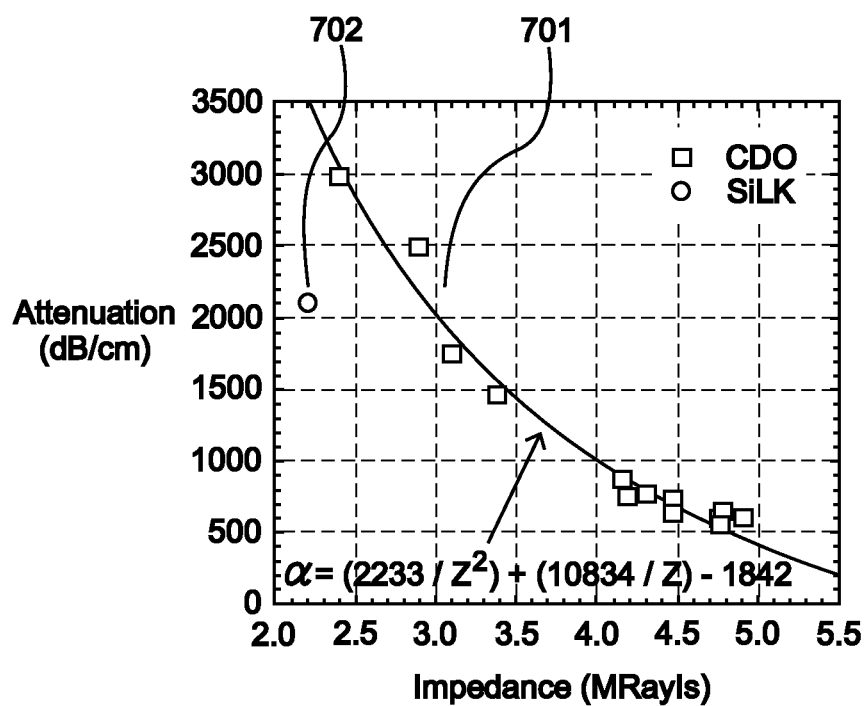
FIG. 7 is a graphical representation of acoustic attenuation versus acoustic impedance of CDO in accordance with a representative embodiment.

FIG. 7 is a graphical representation of acoustic attenuation versus acoustic impedance of CDO acoustic coupling layers in accordance with a representative embodiment. In particular, the acoustic attenuation was determined at 1 GHz using CRFs each comprising a single-material acoustic decoupling layer comprising CDO and having an acoustic impedance ranging from approximately 2.4 MRayls to approximately 5.0 MRayls. As is apparent from FIG. 7, the acoustic attenuation increases comparatively rapidly as the acoustic impedance decreases. An empirical fit to the data is also shown in curve 701 using the equation shown in FIG. 7. Point 702 depicts the fixed acoustic attenuation of a CRF comprising a SiLK™ acoustic coupling layer. As can be appreciated from a review of FIG. 7, a trade-off thus exists between CDO impedance and attenuation. Generally, in representative embodiments, the single-material acoustic coupling layer comprising CDO beneficially has an acoustic impedance in the range of approximately 2.7 MRayls and approximately 5.0 MRayls. By selecting CDO films with acoustic impedance above approximately 4.0 MRayls, an acoustic attenuation that is less than approximately 1000 dB/cm is obtained. This trade-off does not exist for the SiLK™ acoustic coupling layer. Rather, when selecting SiLK™ for the acoustic coupling layer, one is forced to use an acoustic coupling layer with high acoustic attenuation of approximately 2100 dB/cm.

Figure 8:
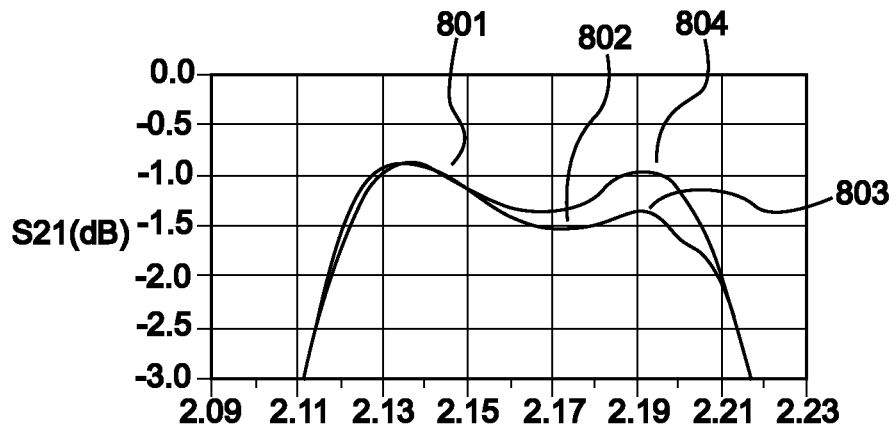
FIG. 8 is a graphical representation of the transmission coefficient ($S_{21}$) versus frequency (in GHz) of a CRF of a representative embodiment, and the transmission coefficient versus frequency of a known CRF.

FIG. 8 is a graphical representation of the transmission coefficient ($S_{21}$) versus frequency (in GHz) of a CRF comprising a BAW resonator structure of a representative embodiment (curve 801), and the transmission coefficient versus frequency of a known CRF (curve 802). The measurements in FIG. 8 are shown for a CRF configured such that the input is connected to electrode 106, first upper electrode 108 and second lower electrode 109 are both connected to ground, and the output signal is connected to second upper electrode 111. The known CRF has a SiLK™ acoustic coupler with an acoustic impedance of 2.2 MRayls. The CRF of the representative embodiment comprises a CDO acoustic coupling layer with an acoustic impedance of 4.8 MRayls.

As noted above, the acoustic attenuation at the even mode resonance (second resonance frequency) of a CRF having a SiLK™ coupling layer is unacceptably large, and causes a 'tilt' of the passband near the even mode resonance frequency. This is plainly shown by the relative 'tilt' of curve 802 compared to curve 801. Moreover, the insertion loss of the known CRF (having a SiLK™ acoustic coupler) at the even mode resonance shown at point 803 is substantially higher (i.e. the SiLK™ acoustic coupling layer results in worse insertion loss) than the insertion loss of the CRF of the representative embodiment shown at 804. Overall, a decrease in filter insertion loss by as much as 0.5 dB is realized in a CRF of the representative embodiment.

In addition to lower acoustic attenuation relative to SiLK™, the conformal step-coverage provided by the PECVD process used to deposit the CDO beneficially provides an improvement in the thickness uniformity of the acoustic coupling layer across the resonator. This significantly reduces, if not substantially eliminates, passband anomalies that were often observed for devices fabricated with a SiLK™ acoustic coupling layer. Because the SiLK™ is deposited using a non-conformal spin-on process, its thickness is reduced around the perimeter of the resonator. Small non-uniformities in the thickness of the acoustic coupling layer perturb the coupling between the pair of resonators comprising the CRF device, and this creates a notch at the high frequency side of the passband. For a SiLK™ acoustic coupling layer, curve 802 in FIG. 8 illustrates this anomaly, at about 2.2 GHz (near 803). These anomalies degraded insertion loss and bandwidth, and were difficult to avoid when using a SiLK™ acoustic coupling layer. The effect is not observed for the CDO-based CRF in FIG. 8 (curve 801), which shows a 'smooth' frequency dependence across the entire passband.

Figure 9:
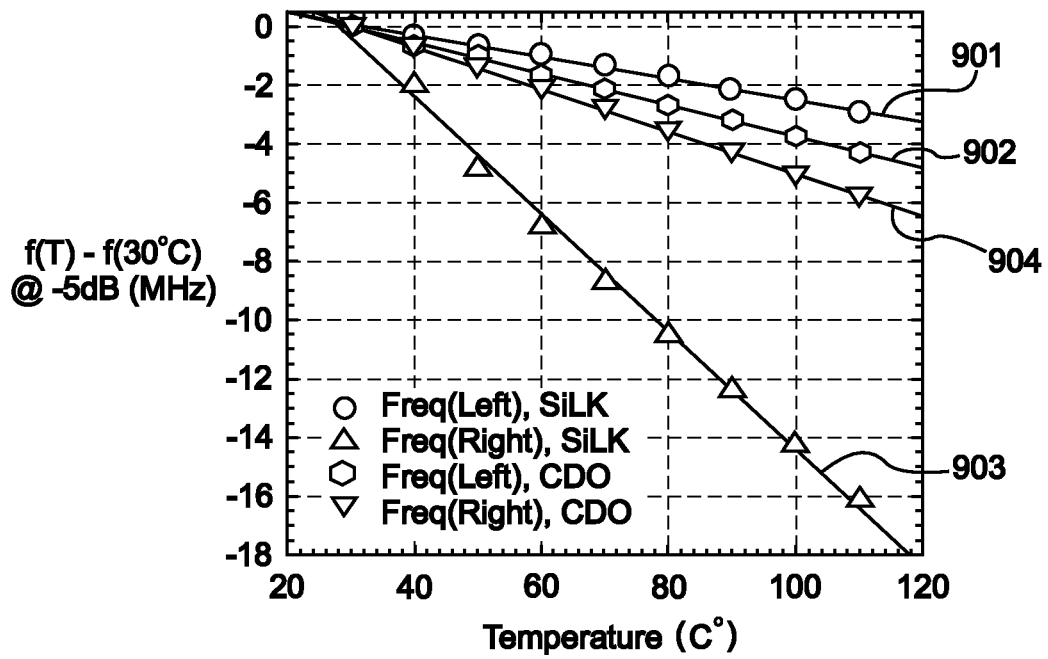
FIG. 9 is a graphical representation of a comparison between the measured TCF of a CRF built with CDO and a comparable device built with SiLK™.

Finally, use of CDO as the acoustic coupling layer also significantly reduces the temperature coefficient of frequency (TCF). FIG. 9 shows a comparison between the measured TCF of a CRF built with CDO and a comparable device built with SiLK™. On the high frequency side of the passband (i.e., the 'right' side of the passband), TCF decreases from −84 ppm/° C. for a SiLK™-based device (curve 903) to −29 ppm/° C. for CDO (curve 904). On the low frequency side of the passband (i.e., the 'left' side of the passband), TCF increases from −15 ppm/° C. for SiLK™ (curve 901) to −23 ppm/° C. for CDO (curve 902). Overall TCF is greatly improved, making filter specifications more readily achieved.

In accordance with illustrative embodiments, BAW resonator structures comprising a single-material acoustic coupling layer and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
    a first BAW resonator comprising a first lower electrode, a first upper electrode and a first piezoelectric layer disposed between the first lower electrode and the first upper electrode;
    a second BAW resonator comprising a second lower electrode, a second upper electrode and a second piezoelectric layer disposed between the second lower electrode and the second upper electrode; and
    a single-material acoustic coupling layer disposed between the first BAW resonator and the second BAW resonator, the single-material acoustic coupling layer comprising an inhomogeneous acoustic property across a thickness of the acoustic coupling layer, wherein the single-material acoustic coupling layer has an acoustic impedance less than approximately 6.0 MRayls and an acoustic attenuation less than approximately 1000 dB/cm.

2. A BAW resonator structure as claimed in claim 1, wherein the single-material acoustic coupling layer comprises carbon-doped silicon oxide (SiOCH).

3. A BAW resonator structure as claimed in claim 1, wherein the single-material acoustic coupling layer comprises one of silicon oxynitride (SiON), boron doped silicate glass (BSG), and phosphosilicate glass (PSG).

4. A BAW resonator structure as claimed in claim 1, wherein the acoustic impedance is less than approximately 5.0 MRayls and greater than approximately 1.0 MRayls.

5. A BAW resonator structure as claimed in claim 1, wherein the acoustic attenuation is greater than approximately 10 dB/cm.

6. A BAW resonator structure as claimed in claim 1, wherein the single-material acoustic coupling layer comprises a single layer.

7. A BAW resonator structure as claimed in claim 1, further comprising an acoustic coupling structure disposed between the first and second BAW resonators, the acoustic coupling structure comprising:
    the single-material acoustic coupling layer; and
    another acoustic coupling layer.

8. A BAW resonator structure as claimed in claim 1, further comprising:
    a first adhesion layer disposed between the single-material acoustic coupling layer and the first BAW resonator; and
    a second adhesion layer disposed between the single-material acoustic coupling layer and the second BAW resonator.

9. A BAW resonator structure as claimed in claim 8, wherein the first adhesion layer is silicon-carbide (SiC).

10. A BAW resonator structure as claimed in claim 8, wherein the second adhesion layer is silicon-carbide (SiC).

11. A BAW resonator structure as claimed in claim 1, wherein the BAW resonator structure comprises a coupled resonator filter (CRF).

12. A BAW resonator structure as claimed in claim 1, the acoustic impedance varies by a factor of approximately 2:1 over the thickness of the single-material acoustic coupling layer.

13. A BAW resonator structure as claimed in claim 1, wherein the acoustic attenuation is greater than approximately 10 dB/cm and less than approximately 1000 dB/cm.

* * * * *